United States Patent
Liu

(10) Patent No.: US 9,947,796 B2
(45) Date of Patent: Apr. 17, 2018

(54) OXIDE THIN FILM TRANSISTOR AND MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventor: Xiang Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/422,832

(22) PCT Filed: Apr. 30, 2014

(86) PCT No.: PCT/CN2014/076617
§ 371 (c)(1),
(2) Date: Feb. 20, 2015

(87) PCT Pub. No.: WO2015/096342
PCT Pub. Date: Jul. 2, 2015

(65) Prior Publication Data
US 2015/0349139 A1 Dec. 3, 2015

(30) Foreign Application Priority Data
Dec. 23, 2013 (CN) .......................... 2013 1 0717574

(51) Int. Cl.
*H01L 29/786* (2006.01)
*H01L 27/12* (2006.01)
(Continued)

(52) U.S. Cl.
CPC ...... *H01L 29/78618* (2013.01); *H01L 21/321* (2013.01); *H01L 21/32051* (2013.01);
(Continued)

(58) Field of Classification Search
CPC ................................................ H01L 29/66742
See application file for complete search history.

(56) References Cited

U.S. PATENT DOCUMENTS

2005/0275038 A1* 12/2005 Shih .................. H01L 29/78633
257/382
2008/0020520 A1* 1/2008 Jan .......................... H01L 27/12
438/149
(Continued)

FOREIGN PATENT DOCUMENTS

| CN | 102832253 A | 12/2012 |
|----|-------------|---------|
| CN | 103022149 A | 4/2013 |

(Continued)

OTHER PUBLICATIONS

International Search Report dated Apr. 30, 2014 corresponding to application No. PCT/CN2014/076617.
(Continued)

*Primary Examiner* — Mounir Amer
(74) *Attorney, Agent, or Firm* — Nath, Goldberg & Meyer; Joshua B. Goldberg

(57) ABSTRACT

The present invention provides an oxide thin film transistor and a manufacturing method thereof, an array substrate and a display device. The oxide thin film transistor of the present invention comprises a substrate, and a gate, a gate insulation layer, an oxide semiconductor active layer, a source and a drain, which are sequentially formed on the substrate, wherein, the oxide thin film transistor further comprises a transition layer formed between the oxide semiconductor active layer and the source and between the oxide semiconductor active layer and the drain, the transition layer comprises a metal layer and a protective layer, and the protective layer is in contact with the oxide semiconductor active layer, the metal layer is arranged on the protective layer and in
(Continued)

contact with the source and the drain, and the protective layer is made of a metal oxide.

19 Claims, 2 Drawing Sheets

(51) Int. Cl.
*H01L 21/3205* (2006.01)
*H01L 29/66* (2006.01)
*H01L 29/45* (2006.01)
*H01L 21/321* (2006.01)
*H01L 29/06* (2006.01)

(52) U.S. Cl.
CPC .......... *H01L 27/1225* (2013.01); *H01L 29/06* (2013.01); *H01L 29/45* (2013.01); *H01L 29/66742* (2013.01); *H01L 29/7869* (2013.01)

(56) References Cited

U.S. PATENT DOCUMENTS

| | | | | |
|---|---|---|---|---|
| 2009/0321731 | A1* | 12/2009 | Jeong | H01L 29/4908 257/43 |
| 2011/0115763 | A1 | 5/2011 | Yamazaki et al. | |
| 2012/0018720 | A1* | 1/2012 | Park | H01L 27/1214 257/43 |
| 2012/0112184 | A1* | 5/2012 | Yamazaki | H01L 27/124 257/43 |
| 2013/0299991 | A1 | 11/2013 | Tanaka | |
| 2014/0061633 | A1* | 3/2014 | Wang | H01L 21/02172 257/43 |
| 2014/0203275 | A1* | 7/2014 | Kim | H01L 27/1225 257/43 |

FOREIGN PATENT DOCUMENTS

| | | | |
|---|---|---|---|
| CN | 103219389 A | 7/2013 | |
| CN | 103715264 A | 4/2014 | |
| WO | WO 2013104209 A1 * | 7/2013 | ....... H01L 21/02252 |

OTHER PUBLICATIONS

Chinese Patent Application No. 201310717574.6, Office Action dated Apr. 11, 2015, six (6) pages, English translation, three (3) pages.
International Patent Application No. PCT/CN2014/076617, English translation of Written Opinion of the International Searching Authority dated Apr. 30, 2014, three (3) pages. previously submitted in Chinese on Feb. 20, 2015
Office Action dated May 18, 2016 issued in corresponding Chinese Application No. 201310717574.6.
3rd Office Action issued Nov. 28, 2016, in counterpart CN application 201310717574.6, with English translation.

* cited by examiner

OXIDE THIN FILM TRANSISTOR AND MANUFACTURING METHOD THEREOF, ARRAY SUBSTRATE AND DISPLAY DEVICE

This is a National Phase Application filed under 35 U.S.C. 371 as a national stage of PCT/CN2014/076617, filed Apr. 30, 2014, an application claiming the benefit of Chinese Application No. 201310717574.6, filed Dec. 23, 2013, the content of each of which is hereby incorporated by reference in its entirety.

FIELD OF THE INVENTION

The present invention relates to the field of manufacturing technology of thin film transistor, and particularly relates to an oxide thin film transistor and a manufacturing method thereof, an array substrate and a display device.

BACKGROUND OF THE INVENTION

With the advancement of process technology, oxide thin film transistors (Oxide TFT) have been widely used in displays so as to adapt to requirements of thinness, miniaturization and the like for displays.

Oxide thin film transistor array substrate are widely applied in displays (such as liquid crystal displays), as shown in FIG. 1, an existing oxide TFT generally comprises: a substrate 1, a gate provided on the substrate 1, a gate insulation layer 3 covering the gate 2 and an exposed portion of the substrate 1 with respect to the gate 2, an oxide semiconductor active layer 4 provided on the gate insulation layer 3, a source and a drain 6 respectively connected to the oxide semiconductor active layer 4, and an etch stopping layer 5 provided between the source and the drain 6 above the oxide semiconductor active layer 4.

The oxide semiconductor active layer 4 is generally made of an oxide semiconductor material containing at least one element of indium, gallium and zinc, for example, indium gallium zinc oxide (IGTO). The source and the drain 6 is generally made of a metal material such as copper (Cu), titanium (Ti), molybdenum (Mo), an alloy thereof or the like. Inventors found that the metal atoms such as copper, titanium, molybdenum or the like in the material of the source and the drain 6 have poor bonding force, and can easily diffuse or result in electron transfer, and enter into the oxide semiconductor active layer 4 to combine with oxygen ions in the material of the oxide semiconductor active layer 4, thus destabilizing the oxide TFT.

SUMMARY OF THE INVENTION

The technical problem to be solved by the present invention includes providing an oxide thin film transistor and a manufacturing method thereof, an array substrate and a display device, which can prevent the metal atoms in the material of the source and the drain from combining with the oxygen ions in the oxide semiconductor active layer to undermine the stability.

A technical solution adopted to solve the technical problem of the present invention is an oxide thin film transistor comprising a substrate, and a gate, a gate insulation layer, an oxide semiconductor active layer, a source and a drain, which are sequentially formed on the substrate, wherein, the oxide thin film transistor further comprises a transition layer formed between the oxide semiconductor active layer and the source and between the oxide semiconductor active layer and the drain, the transition layer comprises a metal layer and a protective layer, the protective layer is in contact with the oxide semiconductor active layer, the metal layer is arranged on the protective layer and in contact with the source and the drain, and the protective layer is made of a metal oxide.

The transition layer of the oxide thin film transistor of the present invention has a two-layer structure, in which the protective layer is a metal oxide layer, which can prevent the metal atoms in material of the source and the drain from diffusing or electron-transferring into the oxide semiconductor active layer to combine with oxygen ions in the material of the oxide semiconductor active layer, and the metal layer is further provided on the protective layer, which further increases the bonding force of the metal atoms in the material of the source and the drain, and thus improves the stability of the oxide thin film transistor of the present invention.

Preferably, material of the protective layer is an oxide of any one metal material selected from copper, titanium and molybdenum, or an oxide of an alloy material containing any two or more metals selected from copper, titanium and molybdenum.

Preferably, the protective layer has a thickness between 10 Å and 200 Å.

Preferably, the protective layer is formed by performing an oxidation treatment on a metal material layer.

Preferably, the metal layer is made of any one metal material selected from copper, titanium and molybdenum, or an alloy material containing any two or more metals selected from copper, titanium and molybdenum.

Preferably, the metal layer has a thickness between 50 Å and 800 Å.

Preferably, material of the oxide semiconductor active layer is any one of indium gallium zinc oxide, indium zinc oxide, indium tin oxide and indium gallium tin oxide.

Preferably, material of the source and the drain is any one of copper, aluminum, molybdenum and titanium.

Further preferably, metal material for forming the protective layer is the same as that of the metal layer.

A technical solution adopted to solve the technical problem of the present invention is a manufacturing method of the above oxide thin film transistor, which comprises steps of:

forming a gate, a gate insulation layer and an oxide semiconductor active layer on a substrate, sequentially;

forming a protective layer on the substrate with the gate, the gate insulation layer and the oxide semiconductor active layer formed thereon;

forming a metal layer on the substrate with the protective layer formed thereon; and forming a source and drain and a passivation layer on the substrate with the metal layer formed thereon, sequentially.

Preferably, the step of forming the protective layer specifically comprises:

forming a metal material layer on the substrate with the gate, the gate insulation layer and the oxide semiconductor active layer formed thereon, and introducing oxygen simultaneously, so as to form a metal oxide layer, which is the protective layer.

Further preferably, the protective layer is formed by performing an oxygen plasma oxidation treatment on the metal material layer.

The present invention also provides an array substrate comprising the above oxide thin film transistor.

The present invention further provides a display device comprising the above array substrate which includes an oxide thin film transistor.

Figure 1:
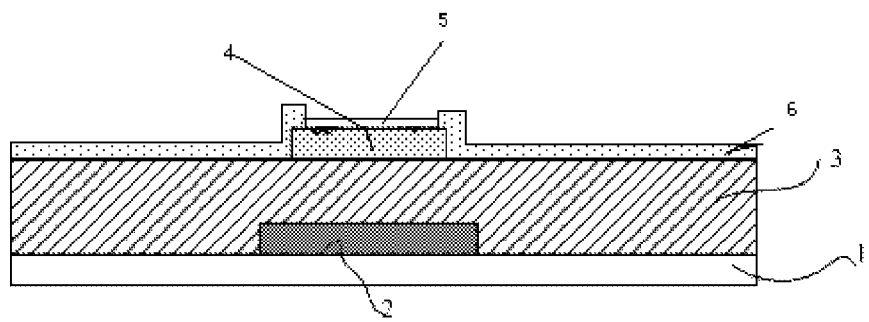
FIG. 1 is a schematic diagram of a structure of an existing oxide thin film transistor.

REFERENCE NUMERALS 1, substrate; 2, gate; 3 gate insulation layer; 4, oxide semiconductor active layer; 5, etch stopping layer; 6, source and drain; 7, transition layer; 7-1, protective layer; 7-2, metal layer.

DETAILED DESCRIPTION OF THE EMBODIMENTS

To enable those skilled in the art to better understand the technical solutions of the present invention, the present invention will be further described in detail below in conjunction with the accompanying drawings and the specific implementations.

Embodiment 1

Figure 2:
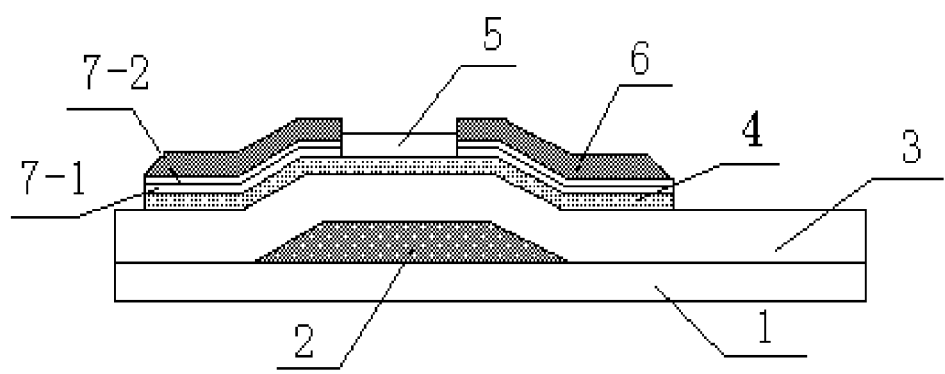
FIG. 2 is a schematic diagram of a structure of an oxide thin film transistor according to Embodiment 1 of the present invention.

FIG. 2 is a schematic diagram illustrating a structure of an oxide thin film transistor according to Embodiment 1 of the present invention. As shown in FIG. 2, the present embodiment provides an oxide thin film transistor comprising a substrate 1, a gate formed on the substrate 1, a gate insulation layer 3 covering the gate 2 and an exposed portion of the substrate 1, an oxide semiconductor active layer 4 formed on the gate insulation layer 3, a transition layer 7 covering the oxide semiconductor active layer 4 and an exposed portion of the gate insulation layer 3, and a source and a drain 6 formed on the transition layer 7 (an etch stopping layer 5 may be provided between the source and the drain 6 above the oxide semiconductor active layer 4, and the etch stopping layer 5 is directly formed on the oxide semiconductor active layer 4 with no transition layer 7 existing therebetween). Here, the transition layer 7 comprises a metal layer 7-2 and a protective layer 7-1, and may also comprise other appropriate layers. The protective layer 7-1 is in contact with the oxide semiconductor active layer 4, the metal layer 7-2 is arranged above the protective layer 7-1 and in contact with the source and the drain 6, and the protective layer 7-1 is made of a metal oxide.

The protective layer 7-1 in the transition layer 7 of the oxide TFT of the present embodiment is a metal oxide layer, which can effectively prevent metal atoms in material of the source and drain 6 from diffusing or electron-transferring into the oxide semiconductor active layer 4 to combine with oxygen ions in the material of the oxide semiconductor active layer 4 and thus destabilize the oxide TFT; meanwhile, the metal layer 7-2 is further provided on the protective layer 7-1, which increases the bonding power of the metal atoms in the material of the source and drain 6, and improves the stability of the oxide TFT.

The gate 2 may be a monolayer film made of any one material selected from molybdenum (Mo), molybdenum and niobium alloy (MoNb), aluminum (Al), aluminum neodymium alloy (AlNd), titanium (Ti) and copper (Cu), or a monolayer film or a multilayer composite layer made of any two or more materials selected from molybdenum (Mo), molybdenum and niobium alloy (MoNb), aluminum (Al), aluminum neodymium alloy (AlNd), titanium (Ti) and copper (Cu). Preferably, the gate 2 is a monolayer film made of any one material selected from Mo, Al, and an alloy containing Mo or Al, or a multilayer composite film made of any two or more materials selected from Mo, Al, and an alloy containing Mo or Al, and has a thickness between 100 nm and 500 nm.

In the present embodiment, the gate insulation layer 3 may be a monolayer film made of any one material selected from silicon oxide (SiOx), silicon nitride (SiNx), hafnium oxide (HfOx), silicon oxynitride (SiON) and aluminum oxide (AlOx), or a multilayer composite layer made of any two or more materials selected from silicon oxide (SiOx), silicon nitride (SiNx), hafnium oxide (HfOx), silicon oxynitride (SiON) and aluminum oxide (AlOx). A thickness of the gate insulation layer 3 is between 100 nm and 600 nm, and may be adjusted according to actual conditions.

Material of the oxide semiconductor active layer 4 may be an oxide semiconductor containing elements such as indium (In), gallium (Ga), zinc (Zn), tin (Sn) or the like, particularly, the material of the oxide semiconductor active layer 4 must include oxygen element and any two or more of the foregoing elements, and preferably, the material of the oxide semiconductor active layer 4 is any one of indium gallium zinc oxide (IGZO), indium zinc oxide (IZO), indium tin oxide (InSnO) and indium gallium tin oxide (InGaSnO). Preferably, the oxide semiconductor active layer 4 has a thickness between 10 nm and 100 nm.

Material of the protective layer 7-1 in the transition layer 7 preferably is an oxide of any one metal material selected from copper (Cu), titanium (Ti) and molybdenum (Mo), or an oxide of an alloy material containing any two or more metals selected from copper (Cu), titanium (Ti) and molybdenum (Mo). Preferably, the protective layer 7-1 is formed by performing an oxidation treatment on a metal material layer which is preferably made of any one metal material selected from copper (Cu), titanium (Ti) and molybdenum (Mo), or an alloy material containing any two or more metals selected from copper (Cu), titanium (Ti) and molybdenum (Mo). Undoubtedly, the metal layer may be made of other metal material. The protective layer 7-1 has a thickness between 10 Å and 200 Å. The metal layer 7-2 is preferably made of any one metal material selected from copper (Cu), titanium (Ti) and molybdenum (Mo), or an alloy material containing any two or more metals selected from copper, titanium and molybdenum. Undoubtedly, other metal material may also be adopted. The metal layer 7-2 has a thickness between 50 Å and 800 Å.

The etch stopping layer 5 may be a monolayer film made of any one material selected from silicon oxide (SiOx), silicon nitride (SiNx), hafnium oxide (HfOx), silicon oxynitride (SiON) and aluminum oxide (AlOx), or a multilayer composite film made of any two or three materials selected from silicon oxide (SiOx), silicon nitride (SiNx), hafnium oxide (HfOx), silicon oxynitride (SiON) and aluminum oxide (AlOx).

The source and the drain 6 may be a monolayer film made of any one material selected from molybdenum (Mo), molybdenum and niobium alloy (MoNb), aluminum (Al), aluminum neodymium alloy (AlNd), titanium (Ti) and copper (Cu), or a monolayer film or a multilayer composite film made of any two or more materials selected from molybdenum (Mo), molybdenum and niobium alloy (MoNb), aluminum (Al), aluminum neodymium alloy (AlNd), titanium (Ti) and copper (Cu). Preferably, the source and the drain 6 is a monolayer film made of any one material selected from Mo, Al, and an alloy containing Mo or Al, or a multilayer composite film made of any two or more materials selected from Mo, Al, and an alloy containing Mo or Al.

Needless to say, a passivation layer may be further provided above the source and drain 6, and the passivation layer may be a monolayer film made of any one material selected from silicon oxide (SiOx), silicon nitride (SiNx), hafnium oxide (HfOx), silicon oxynitride (SiON), aluminum oxide (AlOx) and an organic material, or a multilayer composite film made of any two or more materials selected from silicon oxide (SiOx), silicon nitride (SiNx), hafnium oxide (HfOx), silicon oxynitride (SiON), aluminum oxide (AlOx) and an organic material.

In the present embodiment, the metal material of the metal material layer on which an oxidation treatment is performed to form the protective layer 7-1 is preferably the same as that of the metal layer 7-2. That is to say, if the protective layer 7-1 containing a copper oxide material is formed by performing an oxidation treatment on copper, the material of the metal layer 7-2 also is copper. In this way, in manufacture, there is no need to change a target material, and it only needs to cut off the oxygen, thus improving production efficiency.

Embodiment 2

FIGS. 3A to 3E are schematic diagrams illustrating a manufacturing process of an oxide thin film transistor according to Embodiment 2 of the present invention. As shown in FIGS. 3A to 3E, the present embodiment provides a manufacturing method of the oxide TFT of Embodiment 1, which comprises the following steps.

Figure 3A:
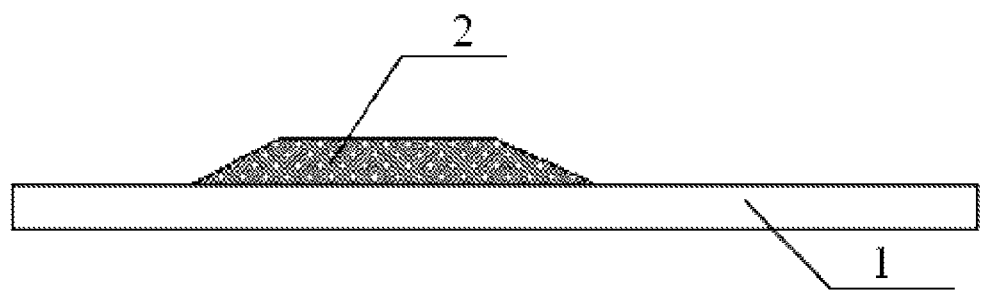
FIGS. 3A to 3E are schematic diagrams illustrating a manufacturing process of an oxide thin film transistor according to Embodiment 2 of the present invention.

At step 1, a gate metal layer, of which a material may be molybdenum (Mo), aluminum (Al) or copper (Cu), or an alloy material formed by combining any two or all of Mo, Al and Cu, is deposited on a substrate 1 by using a magnetron sputtering method, and patterns including a gate 2 and a gate metal wire (not shown in figures) are formed through a patterning process, as shown in FIG. 3A.

Figure 3B:
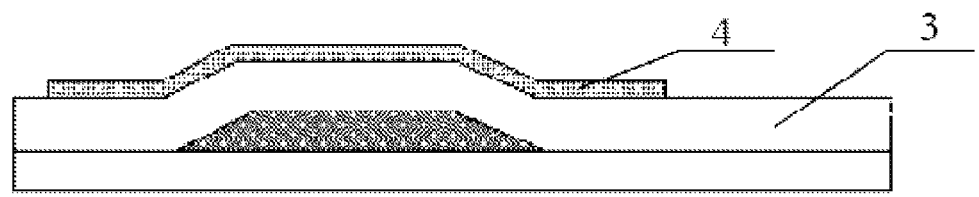

At step 2, a gate insulation layer 3 covering the gate 2 is formed on the substrate 1 subjected to step 1, as shown in FIG. 3B.

At step 3, a metal oxide semiconductor material layer is formed on the substrate 1 subjected to step 2, specifically, the metal oxide semiconductor material layer may be formed in an atmosphere of Ar and O2 at room temperature by using a magnetron sputtering method, and a pattern including an oxide semiconductor active layer 4 is formed through a patterning process, as shown in FIG. 3B. Material of the metal oxide semiconductor material layer (oxide semiconductor active layer 4) is any one of indium gallium zinc oxide, indium zinc oxide, indium tin oxide and indium gallium tin oxide, or may be other oxide semiconductor material. The metal oxide semiconductor layer has a thickness controlled between 1500 Å and 2000 Å.

Figure 3C:
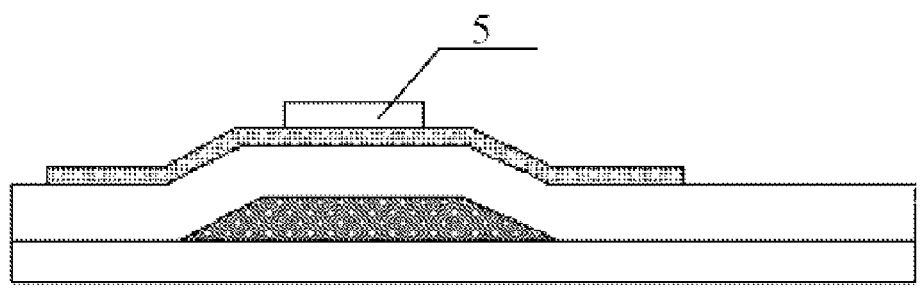

At step 4, a pattern including an etch stopping layer 5 is formed on the substrate 1 subjected to step 3 through a patterning process, as shown in FIG. 3C, and contacting vias for respectively connecting the source and the drain 6 to the oxide semiconductor active layer 4 are formed on the etch stopping layer 4.

Figure 3D:
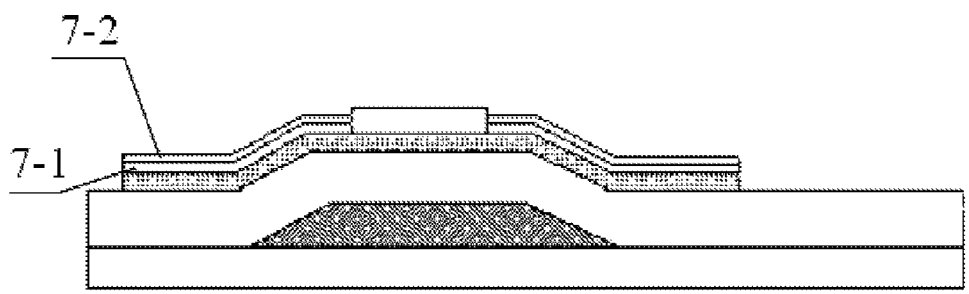

At step 5, patterns including a protective later 7-1 and a metal layer 7-2 are sequentially formed on the substrate 1 subjected to step 4 through patterning processes, as shown in FIG. 3D. Preferably, this step specifically comprises: depositing a metal material layer on the substrate 1 subjected to step 4, introducing oxygen, and forming a metal oxide layer, namely the protective layer 7-1, preferably by performing an oxygen plasma oxidation treatment on the metal layer, and forming the metal layer 7-2 on the formed protective layer 7-1. Preferably, the material of the metal material layer for forming the protective layer 7-1 is the same as the metal material of the metal layer 7-2. In this way, there is no need to change a target material repeatedly, and it only needs to cut off the oxygen, thus improving production efficiency.

Figure 3E:
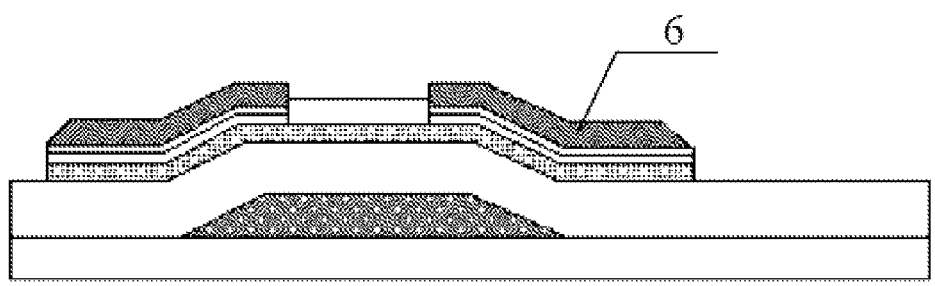

At step 6, patterns including a source and a drain 6 are formed on the substrate 1 subjected to step 5 through a patterning process, as shown in FIG. 3E.

Preferably, step 5 and step 6 may be implemented through one patterning process. Specifically, a protective layer film, a metal layer film and a source and drain film are sequentially formed on the substrate 4 subjected to step 4, and patterns including the protective layer 7-1, the metal layer 7-2, and the source and drain 6 are formed through one patterning process.

At step 7, a passivation layer is formed on the substrate 1 subjected to step 6, so as to form a basic structure of the oxide TFT.

An embodiment of the present invention also provides an array substrate comprising the above oxide TFT.

An embodiment of the present invention also provides a display device comprising the above array substrate which comprises the oxide TFT. The display device may be any product or component with a display function, such as a liquid crystal panel, electronic paper, a mobile phone, a tablet computer, a television, a display, a notebook computer, a digital photo frame, a navigator or the like.

It can be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. An oxide thin film transistor, comprising a substrate, and a gate, a gate insulation layer, an oxide semiconductor active layer, a source and a drain, which are sequentially formed on the substrate, wherein, the oxide thin film transistor further comprises a transition layer formed between the oxide semiconductor active layer and the source and between the oxide semiconductor active layer and the drain, the transition layer comprises a metal layer and a protective layer, and the protective layer is in contact with the oxide semiconductor active layer, the metal layer is in contact with the source and the drain, and the protective layer is made of a metal oxide;

wherein an etch stopping layer is provided only between the source and the drain and directly formed on the oxide semiconductor active layer, and has a thickness smaller than both a sum of a thickness of the source and a thickness of the transition layer and a sum of a thickness of the drain and the thickness of the transition layer, wherein the protective layer is used for preventing metal atoms in a material of the source and the drain from diffusing or electron-transferring into the oxide semiconductor active layer, wherein the metal layer is used for increasing bonding force of the metal atoms in the material of the source and the drain, and wherein metal material for forming the protective layer is the same as that in the metal layer.

2. The oxide thin film transistor according to claim 1, wherein, material of the protective layer is an oxide of any one metal material selected from copper, titanium and molybdenum, or an oxide of an alloy material containing any two or more metals selected from copper, titanium and molybdenum.

3. The oxide thin film transistor according to claim 1, wherein, the protective layer has a thickness between 10 Å and 200 Å.

4. The oxide thin film transistor according to claim 1, wherein, the protective layer is formed by performing an oxidation treatment on a metal material layer.

5. The oxide thin film transistor according to claim 1, wherein, the metal layer is made of any one metal material selected from copper, titanium and molybdenum, or an alloy material containing any two or more metals selected from copper, titanium and molybdenum.

6. The oxide thin film transistor according to claim 1, wherein, the metal layer has a thickness between 50 Å and 800 Å.

7. The oxide thin film transistor according to claim 1, wherein, material of the oxide semiconductor active layer is any one of indium gallium zinc oxide, indium zinc oxide, indium tin oxide and indium gallium tin oxide.

8. The oxide thin film transistor according to claim 1, wherein, material of the source and the drain is any one of copper, aluminum, molybdenum and titanium.

9. A display device, comprising an array substrate which comprises the oxide thin film transistor according to claim 1.

10. The display device according to claim 9, wherein, material of the protective layer is an oxide of any one metal material selected from copper, titanium and molybdenum, or an oxide of an alloy material containing any two or more metals selected from copper, titanium and molybdenum.

11. The display device according to claim 9, wherein, the protective layer has a thickness between 10 Å and 200 Å.

12. The display device according to claim 9, wherein, the metal layer is made of any one metal material selected from copper, titanium and molybdenum, or an alloy material containing any two or more metals selected from copper, titanium and molybdenum.

13. The display device according to claim 9, wherein, the metal layer has a thickness between 50 Å and 800 Å.

14. The display device according to claim 9, wherein, material of the oxide semiconductor active layer is any one of indium gallium zinc oxide, indium zinc oxide, indium tin oxide and indium gallium tin oxide.

15. The display device according to claim 9, wherein, material of the source and the drain is any one of copper, aluminum, molybdenum and titanium.

16. The display device according to claim 9, wherein, metal material for forming the protective layer is the same as that in the metal layer.

17. A manufacturing method of an oxide thin film transistor, wherein the oxide thin film transistor is the oxide thin film transistor according to claim 1, and the manufacturing method comprises steps of:

forming the gate, the gate insulation layer and the oxide semiconductor active layer on the substrate, sequentially;

forming an etch stopping layer on the oxide semiconductor active layer directly;

forming the protective layer on the substrate with the gate, the gate insulation layer and the oxide semiconductor active layer formed thereon;

forming the metal layer on the substrate with the protective layer formed thereon; and forming the source and the drain and a passivation layer on the substrate with the metal layer formed thereon, sequentially, wherein the protective layer is used for preventing metal atoms in a material of the source and the drain from diffusing or electron-transferring into the oxide semiconductor active layer, wherein the metal layer is used for increasing bonding force of the metal atoms in the material of the source and the drain, and wherein the etch stopping layer is provided only between the source and the drain, and has a thickness smaller than both a sum of a thickness of the source and a thickness of the transition layer and a sum of a thickness of the drain and the thickness of the transition layer.

18. The manufacturing method of an oxide thin film transistor according to claim 17, wherein, the step of forming the protective layer specifically comprises: forming a metal material layer on the substrate with the gate, the gate insulation layer and the oxide semiconductor active layer formed thereon, and introducing oxygen simultaneously, so as to form a metal oxide layer, which is the protective layer.

19. The manufacturing method of an oxide thin film transistor according to claim 18, wherein, the protective layer is formed by performing an oxygen plasma oxidation treatment on the metal material layer.

* * * * *